United States Patent [19]
Kira et al.

[11] Patent Number: 5,627,430
[45] Date of Patent: May 6, 1997

[54] DISCHARGE LAMP HAVING A CATHODE WITH A SINTERED TIP INSERT

[75] Inventors: Takehiro Kira, Himeji; Takanori Serizawa, Gotenba; Koichi Ario, Himeji, all of Japan

[73] Assignee: Ushiodenki Kabushiki Kaisha, Japan

[21] Appl. No.: 496,904

[22] Filed: Jun. 29, 1995

[30] Foreign Application Priority Data

Jun. 29, 1994 [JP] Japan ................................ 6-168701
Sep. 6, 1994 [JP] Japan ................................ 6-236089

[51] Int. Cl.⁶ .................................................. H01J 61/04
[52] U.S. Cl. .................. 313/570; 313/620; 313/631; 313/632
[58] Field of Search ................................ 313/570, 574, 313/620, 621, 631, 632, 484, 491, 633, 310, 311, 346 R

[56] References Cited

U.S. PATENT DOCUMENTS

| | | |
|---|---|---|
| 3,902,090 | 8/1975 | Ekkelboom et al. .............. 313/632 |
| 3,970,888 | 7/1976 | Tratiner ............................ 313/346 R |
| 4,937,496 | 6/1990 | Neiger et al. ..................... 313/620 |
| 5,481,159 | 1/1996 | Hiramoto et al. ................. 313/620 |

*Primary Examiner*—Sandra L. O'Shea
*Assistant Examiner*—Vip Patel
*Attorney, Agent, or Firm*—Sixbey, Friedman, Leedom & Ferguson, P.C.; David S. Safran

[57] ABSTRACT

A discharge lamp in which vaporization and melting of a cathode tip are prevented and which has stable luminous operation over a long is achieved according to the invention by the fact that the discharge lamp has a cathode in which a sintered body made of a powdered metal with a high melting point and a powdered emitter material is inserted in the tip, and the relationship:

$$(-0.002d+0.01) \leq D/W \leq (-0.002d+0.04)$$

is fulfilled, where D is an outside diameter of the sintered body in millimeters (mm), W is a lamp input power in watts (w) and d is a distance between the anode and cathode in millimeters (mm). Furthermore, these benefits are achieved according to the invention by encapsulating mercury in an amount of 10 mg to 80 mg/cc of fluorescent tube internal volume and inert gas with at least 2 atm air pressure (at a reference temperature of 25° C.).

2 Claims, 6 Drawing Sheets

Fig. 3

DISTANCE

| BETWEEN ELECTRODES | DIAMETER OF SINTERED BODY | SERVICE LIFE |
|---|---|---|
| 0.5 | 1.0 | ○ |
| 0.5 | 2.0 | ○ |
| 0.5 | 3.0 | ○ |
| 0.5 | 4.0 | UNSTABLE DISCHARGE |
| 0.5 | 5.0 | UNSTABLE DISCHARGE |
| 1.0 | 1.0 | ○ |
| 1.0 | 2.0 | ○ |
| 1.0 | 3.0 | △ |
| 1.0 | 4.0 | UNSTABLE DISCHARGE |
| 1.0 | 5.0 | UNSTABLE DISCHARGE |
| 2.0 | 1.0 | ○ |
| 2.0 | 2.0 | ○ |
| 2.0 | 3.0 | △ |
| 2.0 | 4.0 | UNSTABLE DISCHARGE |
| 2.0 | 5.0 | UNSTABLE DISCHARGE |

Fig. 4

| DISTANCE BETWEEN ELECTRODES | DIAMETER OF SINTERED BODY | SERVICE LIFE |
|---|---|---|
| 2.0 | 1.0 | SHORT SERVICE LIFE |
| 2.0 | 1.5 | △ |
| 2.0 | 2.0 | ○ |
| 2.0 | 2.5 | ○ |
| 2.0 | 3.0 | ○ |
| 3.0 | 1.0 | △ |
| 3.0 | 1.5 | ○ |
| 3.0 | 2.0 | ○ |
| 3.0 | 2.5 | ○ |
| 3.0 | 3.0 | ○ |
| 4.0 | 1.0 | ○ |
| 4.0 | 2.0 | ○ |
| 4.0 | 3.0 | ○ |
| 4.0 | 4.0 | ○ |
| 4.0 | 5.0 | ○ |

Fig. 5

| DISTANCE BETWEEN ELECTRODES | DIAMETER OF SINTERED BODY | SERVICE LIFE |
|---|---|---|
| 2.0 | 1.0 | SHORT SERVICE LIFE |
| 2.0 | 1.5 | SHORT SERVICE LIFE |
| 2.0 | 2.0 | △ |
| 2.0 | 2.5 | ○ |
| 2.0 | 3.0 | ○ |
| 3.0 | 1.0 | SHORT SERVICE LIFE |
| 3.0 | 1.5 | △ |
| 3.0 | 2.0 | ○ |
| 3.0 | 2.5 | ○ |
| 3.0 | 3.0 | ○ |
| 4.0 | 1.0 | ○ |
| 4.0 | 2.0 | ○ |
| 4.0 | 3.0 | ○ |
| 4.0 | 4.0 | ○ |
| 4.0 | 5.0 | ○ |

Fig. 6

| DISTANCE BETWEEN ELECTRODES | DIAMETER OF SINTERED BODY | SERVICE LIFE |
|---|---|---|
| 2.0 | 2.0 | SHORT SERVICE LIFE |
| 2.0 | 2.5 | SHORT SERVICE LIFE |
| 2.0 | 3.0 | △ |
| 2.0 | 4.0 | ○ |
| 3.0 | 1.5 | SHORT SERVICE LIFE |
| 3.0 | 2.0 | △ |
| 3.0 | 3.0 | ○ |
| 3.0 | 5.0 | ○ |

DISCHARGE LAMP HAVING A CATHODE WITH A SINTERED TIP INSERT

BACKGROUND OF THE INVENTION

1. Field of the Invention

The invention relates to a discharge lamp, especially a discharge lamp using a cathode into which a sintered body of a powdered metal with a high melting point and of a powdered emitter material is provided. The invention, furthermore, relates to a mercury lamp.

2. Background of the Disclosure

Discharge lamps of the short arc type, such as a xenon lamp and a mercury lamp are generally widely used as a light source for purposes of illumination, as a light source for a projector and as a light source of a semiconductor exposure device.

In these discharge lamps, a cathode and an anode are arranged opposite one another, a few millimeters apart in a fluorescent tube. For the cathode, a so-called thoriated tungsten is used in which the tungsten contains thorium oxide, and a tip of the cathode is cut in a conical shape for producing stable arc discharge.

However, during luminous operation of the lamp, the cathode has a high temperature due to arc discharge. The above described conical shape is, therefore, deformed by vaporization or melting of the cathode material. This change of the cathode shape causes fluctuation of the position of an arc bright spot which is formed between the electrodes. Consequently, in a device with an optical construction based on the position of the arc bright spot, the desired amount of light can no longer be obtained. Furthermore, the vaporized cathode material adheres to the inner side of the fluorescent tube as a blackened substance; this reduces the amount of light from the lamp. The reduction of the amount of light has major disadvantages, for example, in a lamp which is used for a projector.

On the other hand, a process is also proposed in which a sintered body with a good electron emission characteristic is inserted on the tip of the electrode of thoriated tungsten, and in which electron emission is caused at a low temperature and thus luminous operation of the lamp is accomplished. In the cathode in which this sintered body is fitted, however, it was regarded as disadvantageous that the process of inserting the sintered body fitting is not always possible without problems due to difficulties in cutting to size, and that, in the course of luminous operation of the lamp, the sintered body falls out or changes its position.

SUMMARY OF THE INVENTION

Therefore, the primary object of the present invention is to devise a discharge lamp in which vaporization and melting of a cathode tip are prevented.

A further object of the invention is to obtain a discharge lamp which has stable luminous operation over a long period of use.

These objects and others are achieved in accordance with the present invention by providing the discharge lamp with an extendable cathode which has a sintered body inserted into its tip, this sintered body being formed of a powdered metal with a high melting point and a powdered emitter material. Additionally, this sintered body is dimensioned so that $$(-0.002d + 0.01) \leq D/W \leq (-0.002d + 0.04),$$

where D is the outside diameter of this sintered body in millimeters (mm), W is the lamp input power in watts (w) and d is the distance between the lamp electrodes in millimeters (mm).

These objects are, furthermore, achieved according to the invention by encapsulating mercury in an amount of 10 mg to 80 mg/cc of fluorescent tube internal volume and inert gas with a pressure of at least 2 atm. (at a reference temperature of 25° C.) into the above described discharge lamp.

The inventors have ascertained that the outside diameter of the sintered body is closely associated with the input power of the lamp and the distance between the cathode and anode in the case in which the sintered body is fitted into the cathode main part. The inventors found from this relation that by fixing the outside diameter of the sintered body, a cathode can be devised which does not have the above described disadvantages.

The reason for this is that the input power of the lamp and the distance between the electrodes have a great influence on the temperature of the sintered body. Specifically, the temperature of the sintered body is higher, the higher the input power of the lamp and the shorter the distance between the electrodes become.

When the outside diameter of the sintered body is increased, it can withstand a temperature rise due to its thermal capacity. In this case, however, an unstable arc discharge is engendered.

It was furthermore found that, in a lamp into which mercury is encapsulated, establishing the amounts of mercury and inert gas, likewise, is rather effective for suppression of the temperature increase of the cathode.

These and further objects, features and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 3 is a table which depicts the relationship between the distance between the electrodes and the outer diameter of the sintered body for luminous operation of the lamp with an input power of 100 W;

FIG. 4 is a table which depicts the relationship between the distance between the electrodes and the outer diameter of the sintered body for luminous operation of the lamp with an input power of 250 W;

FIG. 5 is a table which depicts the relationship between the distance between the electrodes and the outer diameter of the sintered body for luminous operation of the lamp with an input power of 350 W;

FIG. 6 is a table which depicts the relationship between the distance between the electrodes and the outer diameter of the sintered body for luminous operation of the lamp with an input power of 500 W;

DETAILED DESCRIPTION OF THE PREFERRED EMBODIMENT

Figure 1:
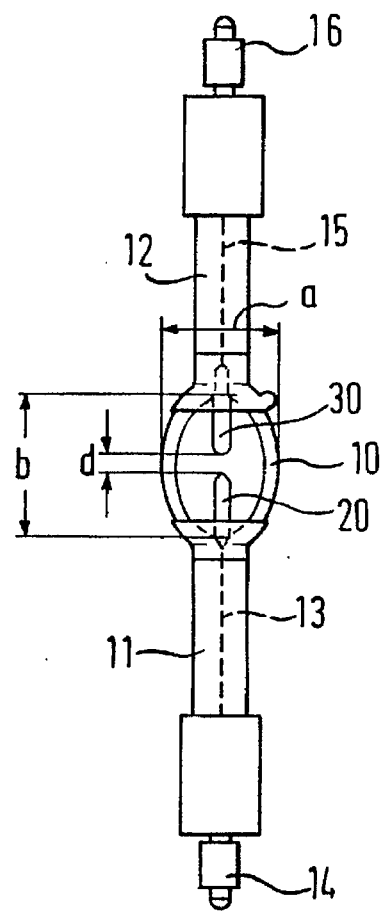
FIG. 1 is a schematic depiction of a discharge lamp according to a preferred embodiment of the invention.

FIG. 1 schematically shows a discharge lamp according to the invention which has, in its center, an emission part 10 that is roughly in the shape of a rugby ball and has hermetically sealed parts 11 and 12 on opposite ends thereof. Emission part 10 has, for example, a minor diameter (width) a of 14 mm and a major diameter (length) b of 24 mm.

Within emission part 10, a cathode 20 and an anode 30 are disposed facing each other, spaced apart by a distance of, for example, 3.0 mm. Cathode 20 is electrically connected to a metal foil 13 located in hermetically sealed part 11 and via it to an outside lead 14. Anode 30 is electrically connected to a metal foil 15 in hermetically sealed part 12 and via it to an outside lead 16.

In a mercury lamp, mercury is encapsulated within emission part 10; its vapor pressure in luminous operation is, for example, 9 atm. air pressure, and xenon gas is encapsulated in a xenon lamp. Furthermore, there are also cases in which, as required, a gas containing a mixture of xenon and mercury is encapsulated. Furthermore, an inert gas, such as argon or the like, is also encapsulated. This lamp has, for example, a power consumption of 250 W and a luminous current of 6.25 amps.

Figure 2:
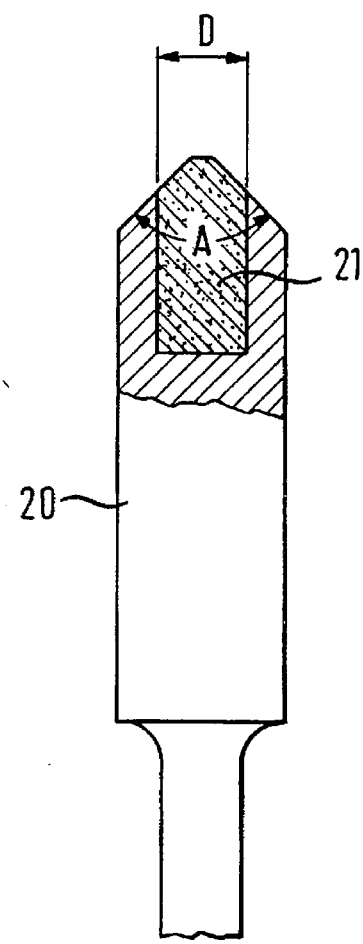
FIG. 2 is a schematic view of a cathode according to the invention.

FIG. 2 schematically shows the cathode according to the invention in an enlarged representation. Cathode 20 is made of a metal with a high melting point such as molybdenum, tungsten, tantalum, niobium or the like, or a mixture thereof. The expression "high melting point" is defined, for example, as a melting point of at least 200° C., and a metal with a melting point of this type is used.

The cathode material must satisfy the condition that it can be expanded. The reason for this is that a sintered body 21 is inserted into the tip of the cathode for a secure seat.

The sintered body 21 is fitted exactly within a cavity formed in the tip of the cathode 20. This means that the outside diameter of sintered body 21 can be adjusted so that it is equal to the inside diameter of the cavity or so that it is somewhat larger in order to obtain a securely fitting arrangement, preferably an interference fit. Furthermore, a seal can be produced from one side of cathode 20 in order that sintered body 21 does not fall out of the cavity.

Sintered body 21 is formed such that a powdered emitter material with advantageous electron emission and a powdered metal with a high melting point are mixed with one another and are press molded to the shape of the cavity of cathode 20. Tungsten, nickel, molybdenum or the like is used for the metal with a high melting point. For the emitter material, alkali earth metals such as strontium, barium, calcium and the like, their oxides, compound oxides of thorium oxide or of alkali earth metals with oxides of other metals (aluminum, zirconium, beryllium, thorium or the like) are used.

The sintered body 21 has a vertex angle A of 20° to 140°. A preferred vertex angle is 70° to 90°. If the vertex angle A is less than 20°, advantageous cutting to size is difficult to do, and break-outs or cracking occur during processing. If the vertex angle is greater than 140°, the arc bright spot formed on the tip of the cathode cannot be fixed in a set position and the cathode becomes larger than necessary.

A sintered body 21 of this type has the effect of lowering the operating temperature for electron emission, and luminous operation can be accomplished with a lower operating temperature as compared to conventional thoriated tungsten. This means that the operating temperature drops and melting of the cathode tip can be prevented. Specifically, the temperature of the cathode is 1200° C. to 1800° C.

Next, tests are described from which the relationship between the input power of the lamp, the distance between the electrodes and the outside diameter of the sintered body can be seen. A mixture of barium oxide as the emitter and tungsten powder as the metal with a high melting point was used as the sintered body. The tests were run by making changes in the distance between the electrodes from 2.0 mm to 4.0 mm, in conjunction with the above described range of the input power and with the area of application having been limited to luminous operation which can be used in practice for industrial applications.

The tests were further run by making changes to the outside diameter of the sintered body from 1.0 mm to 5.0 mm, the tests having been run by limiting the range of application with respect to workability in cutting to size and advantageous arc discharge. The input power of the lamp was changed from 100 W to 500 W according to the area of application of the lamp in which an electrode with this arrangement of the sintered body can be used. If the power is than or equal to 100 W, essentially, the lamp cannot be used for purposes of illumination, for a projector, for purposes of semiconductor exposure and for other purposes as the result of low illumination intensity. If the power is greater than or equal to 500 W, control can no longer be accomplished solely by the above described distance between the electrodes and the above described outside diameter of the sintered body.

The input power of the lamp here designates a power which is supplied between outside leads 14 and 16 shown in FIG. 1. The expression "distance between electrodes" is defined as the shortest distance between the cathode and the anode. The expression "outside diameter of the sintered body" is defined as the outside diameter in a cylindrical part thereof, i.e., outside of the conical part of the tip.

FIGS. 3 through 6 show the results of the tests. For evaluation purposes, the lamps which maintained 70% of their initial illumination intensity after 2000 hours of illumination were labelled 0, while the lamps which maintained 70% of their initial illumination intensity after 1000 hours of illumination, but could not maintain such after 2000 hours of operation were labelled Δ.

The lamps in which 70% of the initial illumination intensity cannot be maintained even after 1000 hours of illumination were called "short service life", and the lamps in which the discharge state is unstable from the start of illumination on are called "unstable discharge." This means that cases in which the illumination intensity is extremely low are called "short service life", and the cases in which the arc discharge becomes unstable are called "unstable discharge". The reasons for having taken 70% as a reference is that it is generally regarded as usable for industrial application if this illumination intensity can be maintained.

FIG. 3 schematically shows the relationship between the distance between the electrodes and the outside diameter of the sintered body in luminous operation of the lamp with an input power of 100 W. Consequently, at an input power of 100 W, regardless of the distance between the electrodes good luminous operation can be accomplished if the outside diameter of the sintered body is 1.0 mm to 3.0 mm. At a greater outside diameter of the sintered body, however, unstable arc discharge is caused.

FIG. 4 is a schematic representation from which the relationship of the distance between the electrodes and the outside diameter of the sintered body in luminous operation of the lamp with an input power of 250 W can be seen. From this, it becomes apparent that, at an input power of 250 W, a temperature rise of the sintered body is caused and that good luminous operation cannot be accomplished over the long term if the distance between the electrodes is 2.0 mm and the outside diameter of the sintered body is 1.0 mm.

On the other hand, it has been found that, with an outside diameter of the sintered body of greater than or equal to 1.5 mm, it can withstand the temperature increase due to heat capacity, even if the distance between the electrodes is 2.0 mm. Furthermore, at a distance between the electrodes of greater than or equal to 3.0 mm, the effect of the temperature increase is manifested only to a slight degree and advantageous luminous operation can be accomplished even if the outside diameter of the sintered body is 1.0 mm.

FIG. 5 schematically shows the relationship of the distance between the electrodes and the outside diameter of the sintered body in luminous operation of the lamp with an input power of 350 W. From this, it becomes apparent that, at an input power of 350 W, as the result of a temperature rise of the sintered body, good luminous operation cannot be accomplished if the distance between the electrodes is 2.0 mm and the outside diameter of the sintered body is less than or equal to 1.5 mm, and furthermore, if the distance between the electrodes is 3.0 mm and the outside diameter of the sintered body is 1.0 mm.

FIG. 6 schematically shows the relationship of the distance between the electrodes and the outside diameter of the sintered body in luminous operation of the lamp with an input power of 500 W. From this, it becomes apparent that, at an input power of 500 W, as the result of a temperature rise of the sintered body, good luminous operation cannot be accomplished if the distance between the electrodes is 2.0 mm and the outside diameter of the sintered body is less than or equal to 2.5 mm, and furthermore, if the distance between the electrodes is 3.0 mm and the outside diameter of the sintered body is less than or equal to 1.5 mm.

All tests which are illustrated in FIGS. 3 through 6 were run using a mercury lamp. However, in a xenon lamp, the same results can also be obtained. Based on these test results, it was found that, by establishing the input power of the lamp, the distance between the electrodes and the outside diameter of the sintered body in the manner described below, the temperature increase of the sintered body and the arc instability can be prevented, and good luminous operation can be accomplished.

This means that it is advantageous to maintain the unitless relationship:

$$(-0.002d+0.01) \leq D/W \leq (-0.002d+0.04),$$

where D is the outside diameter of this sintered body 21 in millimeters (mm), W is the lamp input power in watts (w) and d is the distance between the lamp electrodes in millimeters (mm).

If D/W is less than $(-0.002d+0.01)$, the emitter material vaporizes due to the temperature rise of the sintered body and milky cloudiness occurs on the inside surface of the fluorescent tube.

If D/W is greater than $(-0.002d+0.04)$, an excess reduction of the temperature of the sintered body or an excess increase of the outside diameter of the sintered body occurs, and thus, the arc discharge becomes unstable.

Furthermore, in a lamp in which, in addition to these conditions of the distance between the electrodes and the lamp input power, encapsulation of the mercury is done, that is, in a so-called mercury lamp, the encapsulated amounts of mercury and inert gas can be established.

Specifically, it is desirable that the encapsulated amount of the mercury is greater than or equal to 10 mg and less than or equal to 80 mg/cc of fluorescent tube internal volume. At greater than or equal to 80 mg/cc of fluorescent tube internal volume, the temperature of the cathode becomes very high.

At less than 10 mg/cc of fluorescent tube internal volume the intensity of the ultraviolet radiation is extremely attenuated.

Furthermore, it is desirable to encapsulate the inert gas with less than or equal to 2 atm air pressure (at a reference temperature of 25° C.). The reason for this is that at an encapsulation pressure of less than or equal to 2 atm air pressure, the mercury is not adequately vaporized, and therefore, function as a mercury lamp cannot be maintained even if the lamp is operated, the inert gas being defined as xenon gas or the like. In this case, by supplying a large power, the mercury can be vaporized; however, due to the enlargement of the current source and for similar reasons, the luminous efficiency is poor. Furthermore, the maximum encapsulation pressure of the inert gas is roughly 12 atm. air pressure.

With respect to a process for operating the lamp, a vertical arrangement with a cathode pointed down and an anode pointed up is effective. The reason for this is that a temperature increase of the sintered body of the cathode is prevented.

In a mercury lamp, conventionally, the anode with a high temperature is located underneath, the mercury vaporized, the internal pressure raised and the also the luminous voltage increased to a constant value. If, however, the cathode is pointed down, the disadvantage arises that the mercury is not adequately vaporized since the cathode has a low temperature, and therefore, an increase in the desired luminous voltage cannot be accomplished. By means of the measure according to the invention in which, in a lamp in which mercury is encapsulated, a certain amount of inert gas is encapsulated, however, luminous operation with a cathode pointed down can be accomplished.

Furthermore, by the vertical arrangement, "raising of the arc" which occurs in a horizontal arrangement can be prevented, and thus, no local heating of the fluorescent tube occurs. As a result, both the occurrence of devitrification in the fluorescent tube as well as breaking of the fluorescent tube are prevented.

Figure 7:
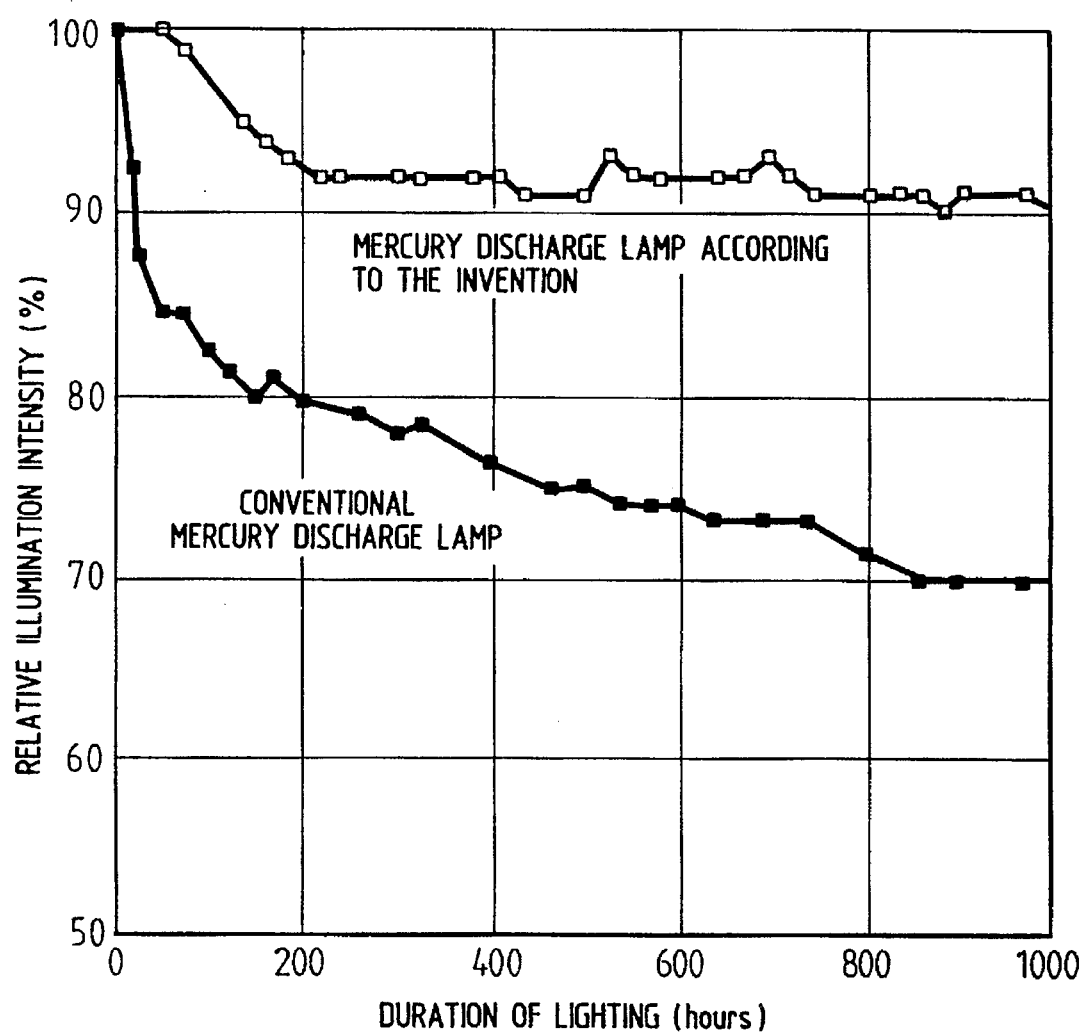
FIG. 7 is a graphic depiction of the relationship between the duration of lighting and the attenuation state of ultraviolet radiation illumination intensity for both a mercury discharge lamp according to the present invention and a conventional mercury discharge lamp.

FIG. 7 shows data which represent an attenuation state of the ultraviolet radiation illumination intensity according to the duration of lighting.

As a discharge lamp, a lamp is used within which mercury and xenon, as the inert gas, were encapsulated. The amount of the mercury encapsulated is 28 mg/cc of fluorescent tube internal volume, and the encapsulated amount of the xenon gas is 6 atm. air pressure.

The cathode has a sintered arrangement in a molybdenum cathode main part, in which tungsten is used as the powdered metal with a high melting point and an emitter powder of alkali earth metals (Sr, Ba, Ca) is used. The lamp has a nominal voltage of 40 V, a nominal current of 6.25 amps, a nominal power consumption of 250 W and a vertical arrangement with a cathode pointed down and an anode pointed up.

Furthermore, in a discharge lamp, for comparison purposes, mercury in an amount of 50 mg/cc of fluorescent tube internal volume and 0.3 atm. air pressure xenon gas were encapsulated. In this case, the cathode does not have a sintered arrangement, but a cathode main part with a mixture of tungsten and thorium was used, and the lamp had a vertical arrangement with a cathode pointed up and an anode pointed down.

From this, it becomes apparent that, in the discharge lamp according to the invention, after the start of luminous operation, the mercury quickly vaporizes, stabilization is achieved and after 1000 hours of luminous operation, 90% of the initial illumination intensity is maintained. On the other hand, it is also apparent that, in the conventional lamp, after 1000 hours of luminous operation, attenuation up to 70% of the initial illumination intensity has occurred.

In the discharge lamp according to the invention, the cathode temperature after 100 hours of luminous operation is less than or equal to 1700° C., and not more than 1800° C., at which ordinarily the service limit is set.

In a conventional mercury lamp, in the course of 100 hours after the start of luminous operation, acute attenuation of the illumination intensity occurs; however, this did not occur in the mercury lamp according to the invention.

In this test, xenon gas was used as the inert gas. However, it was also possible to obtain the same result using krypton, neon or argon.

In the cathode according to the invention with the sintered arrangement, a cathode with a conical tip and a cylindrical body was used. However, it is not always limited to this shape, and for example, the conical tip can be provided with a flat part. The body is not strictly limited to the cylindrical shape, and a polygonal shape can, likewise, be used for this purpose, as required. Furthermore, for the cylindrical shape, a roughly conical trapezoidal shape can also be used in which the outside diameters change in steps in its longitudinal direction towards the hermetically sealed part.

Action of the Invention

It was ascertained in the invention that, in a discharge lamp with a cathode with a sintered arrangement, the outside diameter of the sintered body is closely associated with the input power of the lamp and with the distance between the electrodes, and that by establishing this relationship, the temperature increase of the cathode is prevented and good luminous operation can be accomplished.

It is to be understood that, although preferred embodiments of the invention have been described, various other embodiments and variations may occur to those skilled in the art. Any such other embodiments and variations which fall within the scope and spirit of the present invention are intended to be covered by the following claims.

What we claim is:

1. A discharge lamp comprising an emission part within which an anode and a cathode are located, the cathode having a tip in which a sintered body made of a powdered high melting point metal and a powdered emitter material is inserted, and wherein the unitless relationship:

$$(-0.002d+0.01) \leq D/W \leq (-0.002d+0.04)$$

is fulfilled, where D is an outside diameter of the sintered body in millimeters (mm), W is a lamp input power in watts (w) and d is a distance between the anode and cathode in millimeters (mm).

2. A discharge lamp according to claim 1, wherein mercury in an amount from 10 mg to 80 mg/cc of fluorescent tube internal volume and inert gas at a pressure greater than or equal to 2 atm. at a reference temperature of 25° C. are encapsulated within the emission part.

* * * * *